(12) United States Patent
Arsovski et al.

(10) Patent No.: US 7,986,571 B2
(45) Date of Patent: Jul. 26, 2011

(54) LOW POWER, SINGLE-ENDED SENSING IN A MULTI-PORT SRAM USING PRE-DISCHARGED BIT LINES

(75) Inventors: Igor Arsovski, Williston, VT (US); Michael T. Fragano, Essex Junction, VT (US); Robert M. Houle, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/858,499

(22) Filed: Aug. 18, 2010

(65) Prior Publication Data
US 2010/0309740 A1 Dec. 9, 2010

Related U.S. Application Data

(62) Division of application No. 12/135,237, filed on Jun. 9, 2008, now Pat. No. 7,830,727.

(51) Int. Cl.
*G11C 7/06* (2006.01)
(52) U.S. Cl. .......... 365/189.15; 365/203; 365/204; 365/156; 365/230.05; 365/227
(58) Field of Classification Search .......... 365/156, 365/154, 190, 205, 208, 207, 203, 204, 230.05, 365/189.15, 227
See application file for complete search history.

(56) References Cited

U.S. PATENT DOCUMENTS

| | | | |
|---|---|---|---|
| 4,413,330 A | 11/1983 | Chao et al. | |
| 4,656,361 A | 4/1987 | McIntyre | |
| 6,262,912 B1 | 7/2001 | Sywyk et al. | |
| 7,161,868 B2 | 1/2007 | Morishima | |
| 7,272,061 B2 | 9/2007 | Saleh | |
| 7,345,936 B2 | 3/2008 | Notani | |
| 7,830,727 B2 * | 11/2010 | Arsovski et al. | 365/189.15 |
| 7,859,921 B2 * | 12/2010 | Arsovski et al. | 365/189.15 |
| 2002/0172076 A1 | 11/2002 | Marotta et al. | |
| 2004/0243758 A1 | 12/2004 | Notani | |
| 2007/0263435 A1 | 11/2007 | Nii | |

* cited by examiner

*Primary Examiner* — Andrew Q Tran
(74) *Attorney, Agent, or Firm* — Cantor Colburn LLP; Michael LeStrange

(57) ABSTRACT

An apparatus and method for low power, single-ended sensing in a multi-port static random access memory (SRAM) using pre-discharged bit lines includes holding a bit line associated with the memory cell at a zero voltage potential when the memory cell is not being accessed; releasing the bit line from being held at a zero voltage potential when the memory cell is being accessed; charging the bit line to a first voltage potential greater in value than the zero voltage potential during an access of the memory cell, wherein charging the bit line to a first voltage potential occurs for a first predetermined period of time after access to the memory cell has begun; and sensing the memory cell contents during an access of the memory cell, wherein sensing of the memory cell contents occurs for a second predetermined period of time after access to the memory cell has begun.

10 Claims, 4 Drawing Sheets

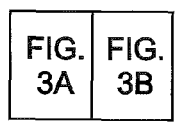
FIG. 3
FIG. 3A
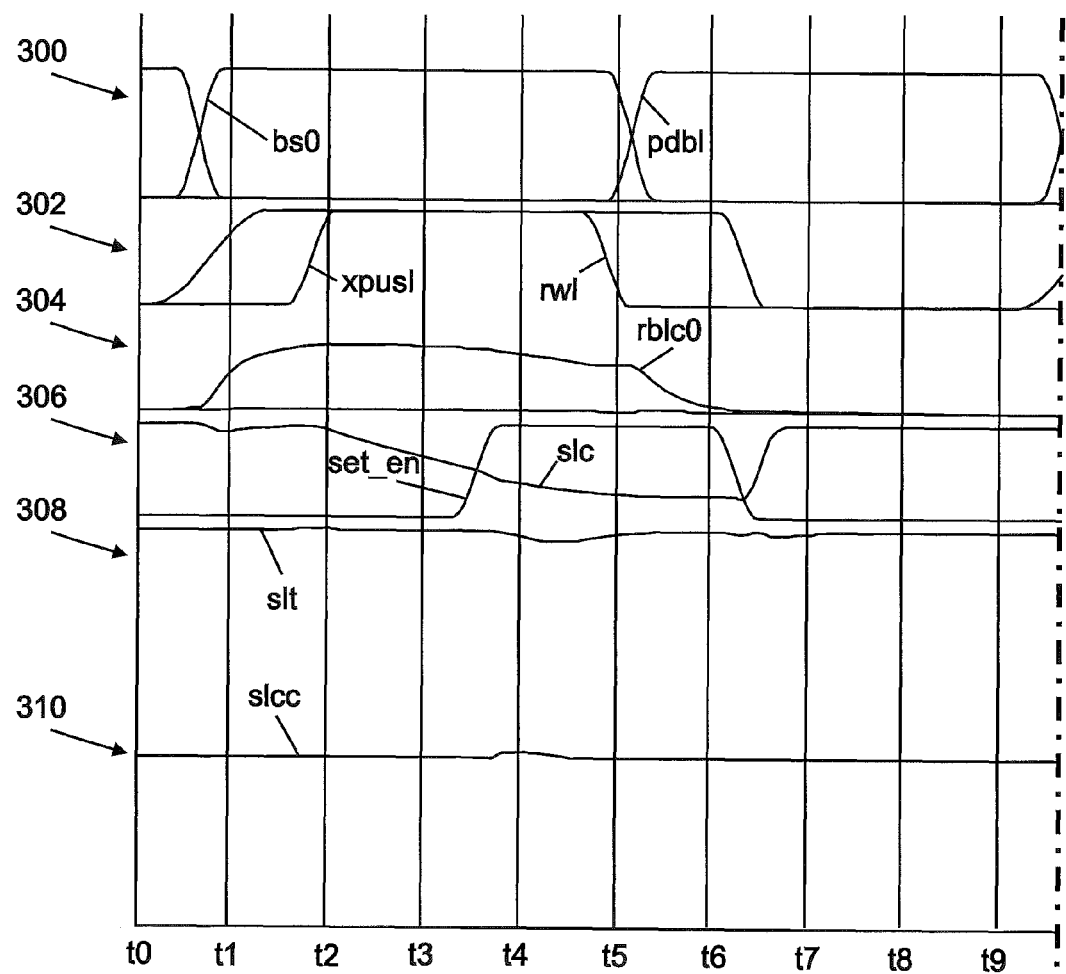

LOW POWER, SINGLE-ENDED SENSING IN A MULTI-PORT SRAM USING PRE-DISCHARGED BIT LINES

CROSS-REFERENCE TO RELATED APPLICATION

This application is a divisional of U.S. patent application Ser. No. 12/135,237, filed Jun. 9, 2008, the disclosure of which is incorporated by reference herein in its entirety.

BACKGROUND

The present invention relates generally to memory devices and, more particularly, to an apparatus and method for low power, single-ended sensing in multi-port semiconductor memories using pre-discharged bit lines.

As integrated circuit (IC) technology dimensions continue to decrease, multi-port static random access memory (SRAM) structures are becoming more prevalent. Besides being able to perform multiple functions simultaneously within a single operation (e.g., reading and writing), multi-port SRAMs also provide the advantage that the read operation does not disturb the contents of the memory cell. This allows the basic six transistor (6T) storage cell and write port to be relatively stable and also writeable through use of write assist circuitry.

A typical 6T SRAM cell includes an array (rows, columns) of individual SRAM cells. Each SRAM cell is capable of storing a voltage value therein, which voltage value represents a corresponding binary logical data bit value (e.g., a "low" or "0" value, and a "high" or "1" value). One existing configuration for an SRAM cell includes a pair of cross-coupled devices such as inverters. Using CMOS (complementary metal oxide semiconductor) technology, each inverter comprises a pull-up PFET (p-channel) transistor connected to a complementary pull-down NFET (n-channel) transistor, with the two transistors in each inverter typically connected in series between a positive voltage potential and ground. The inverters, further connected in a cross-coupled configuration, act as a bistable latch that stores the data bit therein so long as power is supplied to the memory array.

The typical SRAM cell also includes a read port, which can be dual-ended or single-ended. In dual-ended read ports, both the true and complement signal lines are generated within the cell and provided on local read bit lines through a column multiplexer to a sense amp. In single-ended read ports, only the true signal (or only the complement signal) is generated and sent to the sensing circuitry. Single-ended read port structures are significantly more area efficient than dual-ended read port structures because they require half the number of transistors per read port and half the number of signal lines. However, because they are single-ended, they cannot use common sense amp detection circuits, which require both true and complement signals. Hence, single-ended read port structures usually employ domino-type sensing circuitry in which the local read bit line is pre-charged to a high logic level and must be discharged to a low-enough voltage through the read port of the cell to activate the next stage. Because the read port devices are relatively small, the discharge rate of the local bit lines can be relatively slow. This limits the number of cells that can be placed on the local bit line and increases the number of domino sensing circuits required. This counteracts some of the area reduction benefit that single-ended designs provide. Dual-ended designs also pre-charge the local bit lines high, but because they are dual-ended, sense amp sensing circuits can be used to detect small voltage differences (usually 100 mV) between the true and complement signal lines. This can allow for faster operation, or more cells per local bit line.

The transistors within the typical SRAM cell exhibit relatively significant current leakage, particularly at the word-line transistor gates and the bit-line transistor gates. Since known SRAM cell designs require a constant power level both to maintain the data bit stored in the SRAM latch and to allow the reading from and the writing to of data, the current leakage increases the power used by the array of SRAM cells. For example, one common technique is to continuously pre-charge all of the read bit lines within the SRAM to a logical high level; for example, to a positive voltage of +1 volts. This is found in both dual- and single-ended read port structures. The pre-charge is done when the bit lines are not being accessed. After a read cycle involving selected read bit lines, the bit lines are returned to their pre-charge state. Also, since one local bit line per physical column is always discharged, AC power is consumed in recharging that local bit line. The resulting undesirable use of power in these prior art designs increases with the increase in SRAM cell density and the overall number of cells on an integrated circuit, such as a stand-alone memory device, or as part of a processor or application-specific integrated circuit (ASIC).

Various techniques to reduce the leakage current have been proposed, such as increasing the size of the cell by making the devices longer, increasing the threshold voltages of the cell, adding additional transistors to the cell, or lowering the voltage to the array when the cell is not being accessed. However, all of these techniques can increase the area of the array, or significantly reduce the performance of the array.

What is needed is an apparatus and method to reduce both the DC power consumption in a multi-port SRAM cell due to relatively large cell current leakage and as well as to reduce the AC power consumption in the multi-port SRAM cell due to relatively large bit line voltage swings, as also to reduce the area taken up by an SRAM cell on the IC.

SUMMARY

The foregoing discussed drawbacks and deficiencies of the prior art are overcome or alleviated, in an exemplary embodiment, by an apparatus for low power, single-ended sensing in a multi-port SRAM using pre-discharged bit lines. In an exemplary embodiment, the apparatus includes a first switch that switches a bit line associated with the memory cell to a zero voltage potential when the memory cell is not being accessed, wherein the first switch releases the bit line from the zero voltage potential when the memory cell is being accessed; a second switch that switches a sense line to a first voltage potential for a first predetermined period of time when the memory cell is being accessed, wherein the first voltage potential is greater than the zero voltage potential; and a third switch that connects the sense line with the bit line when the memory cell is being accessed, wherein the bit line is charged to a second voltage potential when the memory cell is being accessed, and wherein the second voltage potential represents the value in the memory cell.

In another exemplary embodiment, a method for low power, single-ended sensing in a multi-port SRAM using pre-discharged bit lines includes holding a bit line associated with the memory cell at a zero voltage potential when the memory cell is not being accessed; releasing the bit line from being held at a zero voltage potential when the memory cell is being accessed; charging the bit line to a first voltage potential greater in value than the zero voltage potential during an access of the memory cell, wherein charging the bit line to a first voltage potential occurs for a first predetermined period of time after access to the memory cell has begun; and sensing the memory cell contents during an access of the memory cell, wherein sensing of the memory cell contents occurs for a second predetermined period of time after access to the memory cell has begun.

BRIEF DESCRIPTION OF THE SEVERAL VIEWS OF THE DRAWINGS

Referring to the exemplary drawings wherein like elements are numbered alike in the several Figures.

DETAILED DESCRIPTION

Disclosed herein is an apparatus and method for low power, single-ended sensing in a multi-port semiconductor memory using pre-discharged bit lines. Briefly stated, the apparatus and method pre-charges the SRAM read port bit lines to a logic low level of zero volts (i.e., "pre-discharges" the bit lines), wherein the read port bit lines of the multi-port SRAM do not leak DC current when pre-discharged as such. The apparatus and method holds the SRAM read port bit lines that are not being read at any particular point in time at ground (zero voltage) potential, and energizes selected read port bit lines (i.e., applies a potential thereto) only when the selected read port bit lines are accessed to read or sense the stored information within the selected memory cell. The sensing circuit pre-charges only the selected bit line to a partially high logic level, waits for the cell state to influence the bit line, and detects the result. That is, the potential applied to the selectively energized read bit lines is lower in value than the full rail voltage potential (typically +1 volts or Vdd). Applying a potential to the selected read bit lines at some intermediate value between Vdd and ground saves AC power due to the resulting relatively lower voltage swings on these bit lines.

Figure 1:
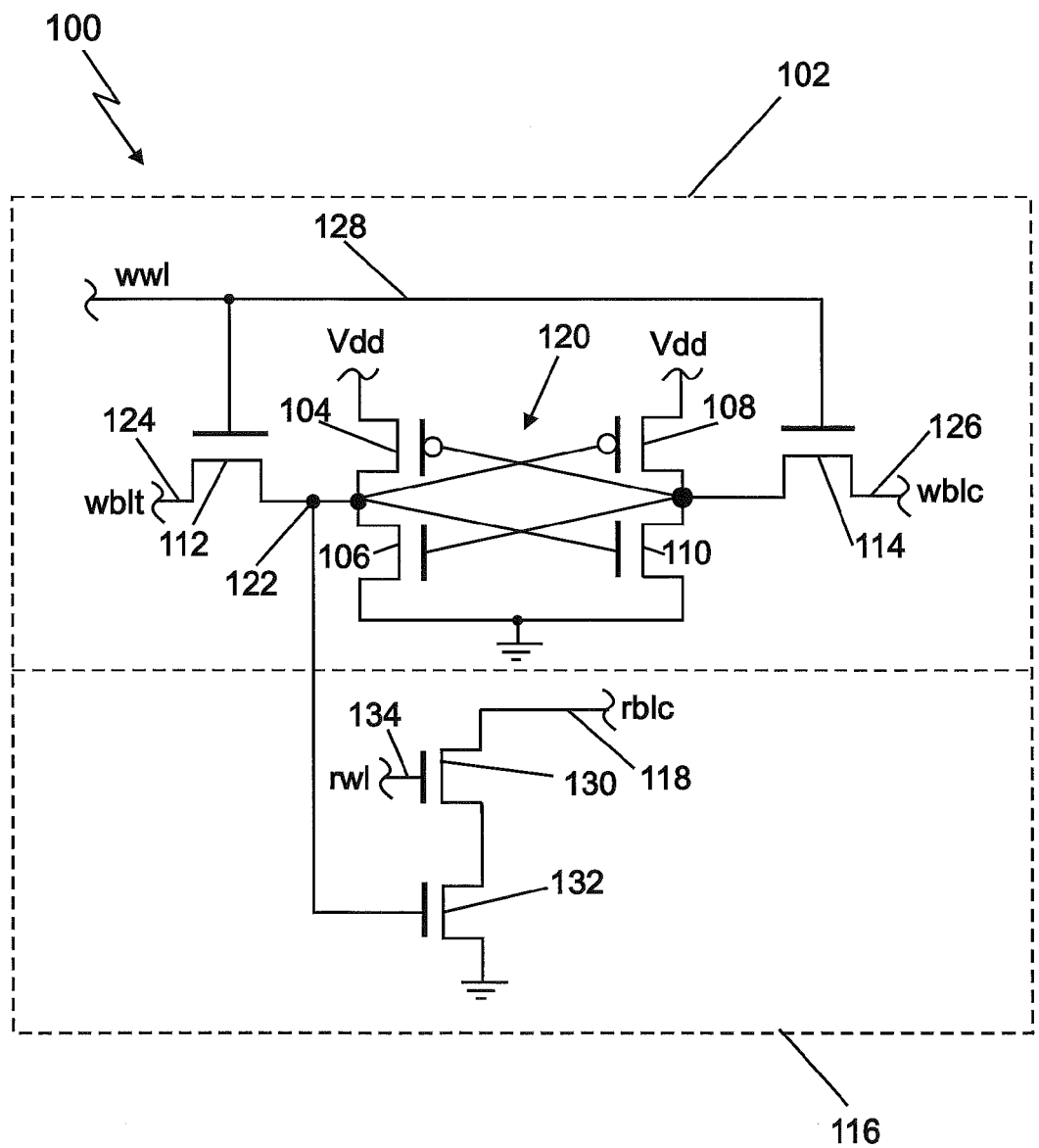
FIG. 1 is a schematic diagram of a multi-port SRAM cell.

Referring to FIG. 1, there is shown a typical multi-port (i.e., two port) SRAM memory cell 100. The cell 100 includes a base cell 102 that comprises six transistors 104-114, wherein the base cell 102 constitutes both the write port of the memory cell 100 and the basic storage element of the memory cell 100. FIG. 1 also shows a single-ended read port 116 that has only a single read bit line (here, the complement read bit line, rblc 118). A plurality of the read ports 116 may be used as part of a single memory cell 100, if desired.

The base cell 102 of FIG. 1 includes a bistable latch 120 comprising a first pair of PMOS (e.g., PFET) and NMOS (e.g., NFET) transistors 104, 106 connected in series as an inverter between a positive power supply potential Vdd (e.g., +1 volts) and a ground potential (e.g., 0 volts). The latch 120 further comprises a second pair of PMOS and NMOS transistors 108, 110, also connected in series as an inverter between the power supply potential Vdd and ground. The transistors 108, 110 have their respective gate terminals connected to a "true" storage node 122, which is also connected to the drain terminals of both transistors 104, 106, which drain terminals are connected together. Thus, the PMOS transistors 104, 108 operate as load transistors and the NMOS transistors 106, 110 operate as drive transistors within the base cell 102.

The base cell 102 also includes two NMOS transistors 112, 114. A first transistor 112 is connected between a true write bit line, wblt 124, and the storage node 122. A second transistor 114 is connected between a complement write bit line, wblc 126, and the drain connection of the two transistors 108, 110. Gate terminals of these transistors 112, 114 are connected to a common write word line, wwl 128. As such, the transistors 112, 114 each have their respective gate potentials controlled by the write word line, wwl 128.

The read port 116 includes two NMOS transistors 130, 132 connected in series between the complement read bit line, rblc 118, and ground. The gate terminal of the transistor 130 is connected to a common read word line, rwl 134. As such, the transistor 130 has its gate potential controlled by the read word line, rwl 134. The gate of the transistor 132 is connected to the true storage node 122 in the base cell 102. Alternatively, the gate of the transistor 132 may be connected to a "complement" storage node formed at the junction of the two transistors 108, 110 in the base cell 102. In this alternative, the resulting read bit line is a true read bit line, rblt, which is the output of the read port 116 on the line 118. In general, the transistors 130, 132 within the read port 116 do not necessarily need to be long channel or SRAM-type high voltage threshold devices—they can be regular threshold devices. It suffices that these transistors 130, 132 are such that any current leakage does not degrade the signal to a large enough extent to cause any read errors.

In operation of the base cell 102 and the read port 116, when the common write word line, wwl 128, is active, access to the cell for write or read operations is enabled. Thus, when wwl 128 is active, data may be written to the storage node 122 via the true write bit line wblt 124. When the common write word line, wwl 128, is inactive, the data previously written to the storage node 122 is held steady by the latch 120. When the common read word line, rwl 134, is active, data is read or sensed from the storage node 122 via the read bit line, rblc 118, which is at the output of the read port 116. In a typical SRAM memory cell 100, it is not necessary to periodically assert the common write word line 128 (i.e., apply a voltage thereto) to refresh the data held in the latch 120. The data will be held in a steady state in the latch 120 as long as power is continuously applied to the cell 100.

Figure 2:
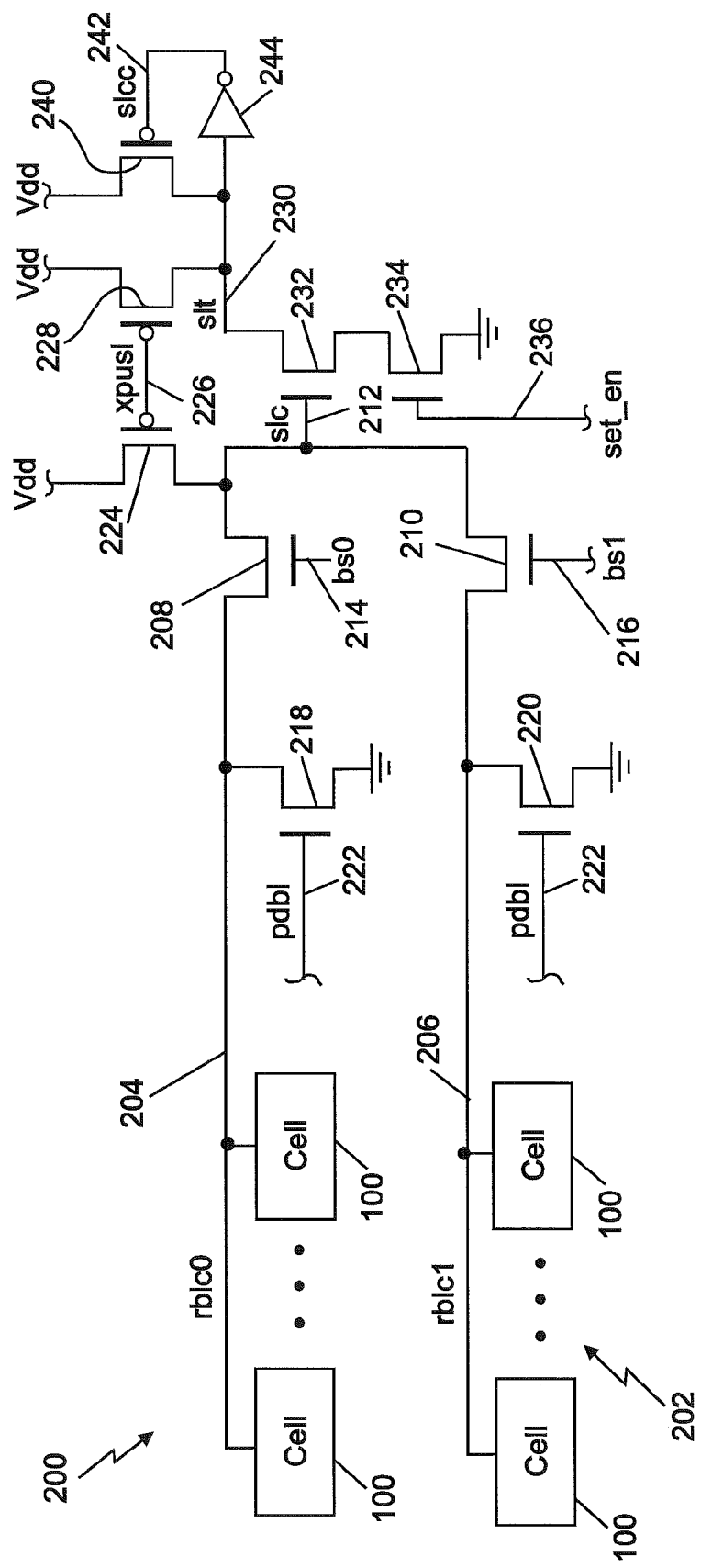
FIG. 2 is a schematic diagram of circuitry that includes the SRAM cell of FIG. 1 and illustrates an exemplary embodiment of the present invention.

FIG. 2 shows an exemplary embodiment of the present invention. In a single-ended sensing apparatus for a multi-port SRAM, multiple rows 200, 202 of SRAM memory cells 100 (two rows 200, 202 are shown, each row having a plurality of cells 100) may be connected together by their respective single read bit line—rblc0 204 for row zero 200, and rblc1 206 for row one 202. These read bit lines 204, 206 comprise the bit line, rblc 118, originating from the read port 116 of each memory cell 100 in FIG. 1. Each read bit line 204, 206 is connected through a corresponding bit switch circuit that comprises an NFET pass gate transistor 208, 210, each transistor having a relatively high voltage threshold. The read bit lines 204, 206 of each row 200, 202 pass through the corresponding bit switch circuits 208, 210 and connect together as a complement sense line, slc 212. The gate terminal of the pass gate NFET transistor 208 for row zero 200 is controlled (i.e., the NFET transistor is turned "on") by a positive active signal line, bso 214. Similarly, the gate terminal of the pass gate NFET transistor 210 for row one 202 is controlled by a positive active signal line, bsl 216.

FIG. 2 also illustrates that, in accordance with an exemplary embodiment of the present invention, the single-ended sensing apparatus further includes an NFET transistor 218, 220 for a corresponding each one of the read bit lines, rblc0 204 and rblc1 206, connected together. The drain terminal of each NFET transistor 218, 220 is connected to the corresponding read bit line 204, 206, while the source terminal of each transistor 218, 220 is connected to ground. The gate terminal of each transistor 218, 220 is connected to a common positive active control signal line, pdbl 222. As described in detail hereinafter, when one or more of the transistors 218, 220 is turned on, the corresponding read bit line 204, 206 is pulled down to ground potential, thereby "pre-discharging" the corresponding read bit line 204, 206 to zero volts. As such, no DC current leakage occurs on these lines 204, 206 when they are pre-discharged in this manner.

The complement sense line, slc 212, is also connected to a sense line pre-charge control circuit that comprises a PFET transistor 224. The gate terminal of this transistor 224 is connected to an active low sense line pre-charge signal, xpusl 226. When this signal, xpusl 226, turns on the transistor 224, the complement sense line, slc 212, is pre-charged to a high logic level of Vdd (e.g., +1 volts). Further detail regarding the operation of the complement sense line, slc 212, and the pre-charge transistor 224, is described hereinafter in conjunction with the signal traces of FIG. 3.

The single-ended sensing apparatus further includes a PFET transistor 228 whose gate terminal is connected to the active low pre-charge signal, xpusl 226. This transistor 228 is connected between Vdd and the true sense line, slt 230. The true sense line 230 is connected to one end of an NFET transistor 232, whose gate terminal is connected to the complement sense line, slc 212. The other end of this transistor 232 is connected to one end of another NFET transistor 234, whose other end is connected to ground, and whose gate terminal is connected to a sense enable signal, sen_en 236. In addition, the apparatus includes yet another PFET transistor 240 connected between Vdd and the true sense line, slt 230. The gate terminal of the transistor 240 is connected to a complement sense line, slcc 242, which is output from an inverter 244, the input of which is the true sense line, slt 230.

In the single-ended sensing apparatus of FIG. 2 in accordance with an exemplary embodiment of the present invention, the read bit lines 204, 206 are pre-charged to a logic low level of, e.g., ground or zero volts ("pre-discharged"), through the NFET transistors 218, 220, rather than to a logic high level of, e.g., Vdd, as in the prior art. Also, as compared to the prior art, the bit switch circuit transistors 214, 216 now comprise relatively high threshold voltage (Vt) NFETS instead of PFETS. In addition, the polarity of the transistor controls signals (i.e., the gate voltage signals) agree with their respective transistor device-types, and the timing of the sense line pre-charge control signal, xpusl 226, has been changed, as illustrated in FIG. 3.

When the read bit lines 204, 206 are pre-charged to a logic low level, no DC leakage occurs through the read ports 116 of the SRAM. A slight delay in reading out the stored data occurs because the read bit lines 204, 206 are energized to an intermediate voltage level between Vdd and ground prior to the sensing or reading out of the stored values therefrom. This is done by keeping the sense line pre-charge control signal, xpusl 226, active for some short time after the word line 128 has been activated, as shown in FIG. 3. AC power is reduced because only selected ones of the bit lines 204, 206 that are being read are energized, and also because, even when energized, the selected bit lines 204, 206 are not fully charged to Vdd but instead are energized to some intermediate value between Vdd and ground. This reduces the amount of the AC voltage swing on the bit lines 204, 206.

Figure 3B:
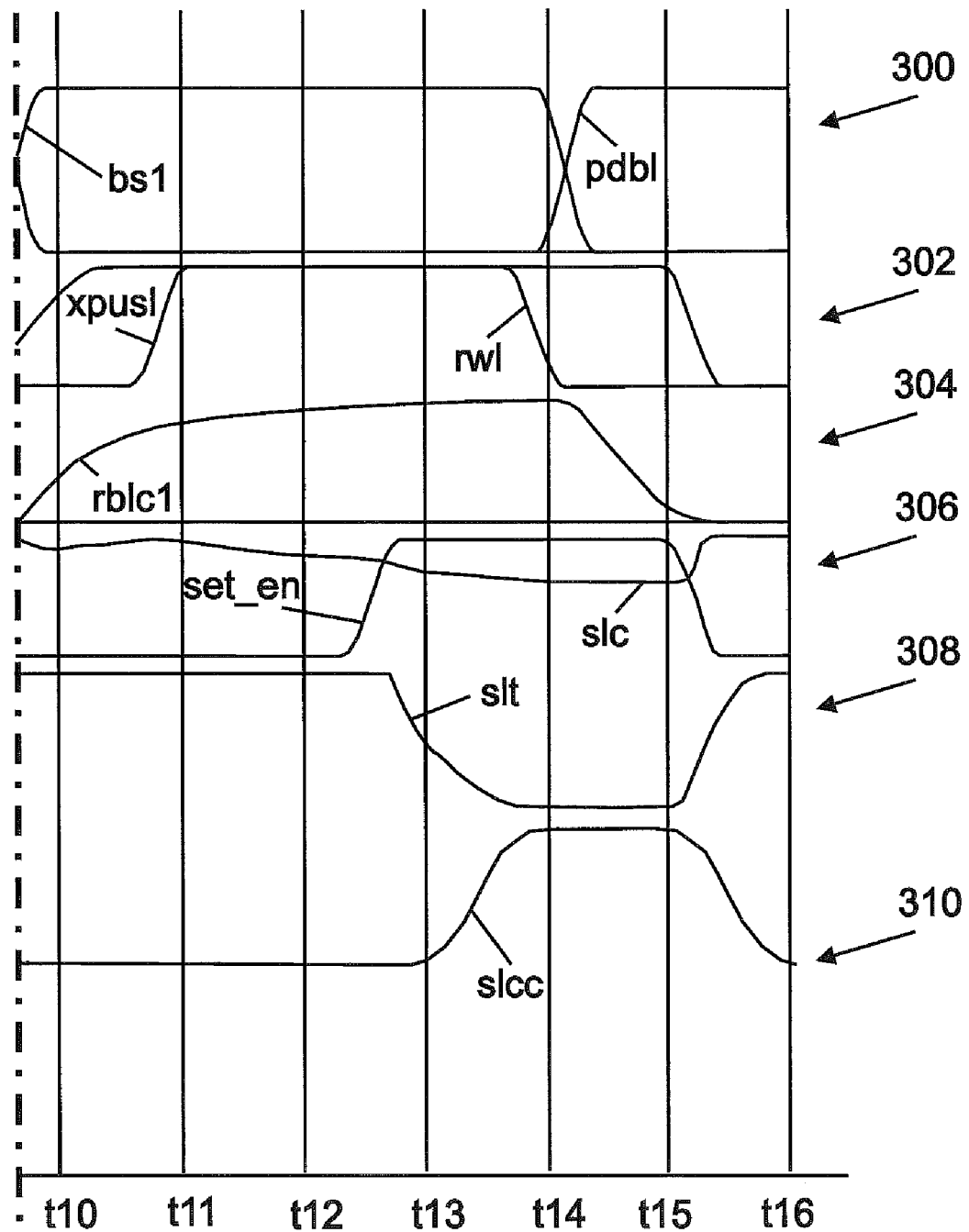
FIG. 3 shows several signal timing diagrams within the circuitry of FIG. 2.

Referring to FIG. 3, there illustrated are several signal traces of voltage values versus time at different points in the circuit of FIG. 2. FIG. 3A illustrates the situation where a logical one is being read from row zero 200 of the memory cell 100, while FIG. 3B illustrates the situation where a logical zero is being read from row one 202 of the memory cell 100. The present invention pre-discharges all of the read bit lines low and then drives current only into the one or more selected read bit lines from a turned on pre-charge transistor 224 through a corresponding NFET bit switch device 208, 210. If the selected memory cell 100 being read contains a logical "0", then the cell's read port 116 will not conduct any current and the voltage on the corresponding read bit line 118 will rise. If the selected memory cell 100 being read contains a logical "1", then the cell's read port 116 will conduct the current being driven, which will counteract the rising voltage of the read bit line 118. By driving the selected bit line through a high threshold voltage (Vt) NFET bit switch device 208, 210, the read bit line voltage will never rise to a full rail potential (Vdd), but to some intermediate value between Vdd and ground.

In the top trace 300 of FIG. 3A, the bit switch control signal, bs0 214, transitions to active high at approximately t=1, thereby turning on NFET 208, while the pass gate transistor control signal, bsl 216, remains at a low logic level, thereby keeping NFET 210 off. Thus, the selected read bit line, rblc0 204 is connected to the complement sense line, slc 212, through the bit switch transistor 208. As a result, a particular memory cell 100 in row zero 200 is selected for a read operation by way of a conventional column selection operation (not shown). In the same trace 300, the pre-charge control signal, pdbl 222, for the NFET 218 assumes a low logic level also at approximately t=1, thereby turning off the NFET 218 (i.e., removing the "pre-discharge" state of the read bit lines, rblc0 204) and allowing the selected row zero cell 100 to be read. When a read operation of a cell 100 is complete, the pre-charge control signal, pdbl 222, assumes a high logic level, thereby restoring the read bit line to ground.

In the next trace 302, also at time t=1 the common read word line, rwl 134 (FIG. 1), assumes a high logic level, thereby turning on the transistor 130 in the read port 116 of the memory cell 100. The sense line pre-charge control signal, xpusl 226, stays at a logic low until approximately t=2, at which time it changes to a logic high, thereby turning off the PFETS 224, 228. This delay between the signal transitions involving rwl 134 and xpusl 226 helps the selected bit line rblc0 204 become energized (i.e., rise in voltage) through charge sharing between the sense line, slc 212, and the selected bit line, rblc0 204. This delay in time between the signal transitions involving rwl 134 and xpusl 226 must be sufficiently long to adequately charge the selected read bit line, rblc0 204, so that the sense line, slc 212, does not droop below the threshold of the sensing circuit when reading a memory cell 100 that contains a logical "0" (FIG. 3B), even when the unselected cells in the selected column are leaking current. The next trace 304 shows the selected read bit line, rblc0 204, for the selected row, row zero 200. The selected read bit line, rblc0 204, is energized and starts to increase in voltage, as described above.

The next trace 306 shows the selected read bit line, rblc0 204, whose voltage starts to rise after the bit switch transistor 208 is activated by the signal, bs0 214, and while the signal, xpusl 226, is still active low. But after xpusl 226 is deactivated high, the contents of the selected cell (a logical "1") start to pull down the read bit line, rblc0 204. In turn, this causes the voltage on the sense line, slc 212, to drop relatively rapidly (i.e., between times t=3 and t=5), due to the fact that the charge sharing between the sense line, slc 212, and the bit line, rblc0 204, is still occurring and to the fact that the cell discharge current of the read bit line is amplified at the sense line by the ratio of bit line capacitance to the sense line capacitance. In the second, "read 0" cycle of this trace 306

(FIG. 3B), the read bit line, rblc1 206, does not drop in voltage after the sense line pre-charge signal, xpusl 226, is deactivated at approximately t=11, because the selected cell 100 contains a logical "0" which will not pull down on the read bit line.

The next trace 306 shows the sense line, slc 212, and the sense strobe signal, set_en 236. The timing between the deactivation of the sense pre-charge signal, xpusl 226, and the activation of the sense strobe, set_en 236, is large enough to ensure that the weakest cell has sufficiently pulled down the read bit line and, consequently, the sense line not to trip the sense circuit when the signal, set_en 236, is asserted.

The next two traces 308, 310 show the true and complement outputs of the sense circuit, slt 230, and slcc 242. They are pre-charged to reflect the case where the cell 100 is assumed to contain a logical "1" so in the first cycle (FIG. 3A), they do not switch, while in the second cycle (FIG. 3B), they do switch.

The traces in FIG. 3B are somewhat similar to those described in conjunction with FIG. 3A. The primary difference is that while in FIG. 3A a logical "1" is being read from a selected memory cell 100 in row zero 200, in FIG. 3B a logical "0" is being read from a selected memory cell 100 in row one 202.

The apparatus and method of the present invention pre-charges the read port bit lines 204, 206 to a logical low level so that the read ports 116 of the multi-port SRAM do not leak DC current. The bit lines 204, 206 are held at ground and energized only when they are accessed, as shown in FIG. 3. Hence the read port DC leakage due to the SRAM cells is reduced to zero. There is a small amount of current leakage through the bit switch transistors 208, 210. However, this amount of leakage is significantly less than that of the cells for all but the smallest SRAM sizes. In addition, the AC power is reduced because the bit lines 204, 206 are not fully charged to a full voltage rail potential when they are energized (as shown in FIG. 3), and also because only the bit lines 204, 206 that are being read are energized. When the selected read bit lines 204, 206 are energized, some current leakage occurs. However, because typically only a selected few, and not all, of the bit lines are energized at any one point in time, the overall amount of current leakage caused by the energized bit lines is significantly lower then in the prior art where all of the bit lines are typically pre-charged to Vdd.

The read performance is delayed slightly to allow the bit lines to energize to some intermediate voltage lower than Vdd prior to the read operation. The delay penalty is small, and depends on the technology voltage and temperature. For example, in a 65 nm CMOS bulk technology at a slow process corner and low voltage, the delay penalty is about 140 ps. At a 1 GHz cycle time, this would represent a 14% decrease in performance. With newer technologies, the write time of the cell limits the performance more than the read time, so delaying the read slightly may not affect overall performance at all. Implementation of the present invention requires no additional area over current multi-port SRAM designs and, in fact, the area is significantly reduced as compared to prior art dual-ended read embodiments.

The expected power savings brought about by the present invention depends on the memory configuration and the operating voltage. For example, at 1V in a 65 nm CMOS-bulk technology, a two-port array configured as 8 columns with 64 cells per column, a savings of approximately 654 nW per sense amp occurs. At a cycle time of 900 ps, the AC power savings are 2400 nW per sense amp. For an ASIC design employing 60 two-port SRAM macros, each with 2000 sense amps, then approximately 78 mW leakage and 0.29 W AC power per chip may be saved.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for sensing contents of a memory cell within a semiconductor memory, comprising:
  holding a bit line associated with the memory cell at a zero voltage potential when the memory cell is not being accessed;
  releasing the bit line from being held at the zero voltage potential when the memory cell is being accessed;
  charging the bit line to a first voltage potential greater in value than the zero voltage potential during an access of the memory cell, wherein charging the bit line to a first voltage potential occurs for a first predetermined period of time after access to the memory cell has begun; and
  sensing the memory cell contents during the access of the memory cell, wherein sensing of the memory cell contents occurs for a second predetermined period of time after access to the memory cell has begun.

2. The method of claim 1, wherein the access of the memory cell is a read access of the memory cell.

3. The method of claim 1, wherein the first voltage potential comprises a voltage value less than a voltage rail potential utilized by the memory cell.

4. The method of claim 1, further comprising pre-charging a sense line to a second voltage potential greater than the first voltage potential prior to charging the bit line to the first voltage potential.

5. The method of claim 4, wherein charging the bit line to a first voltage potential greater than the zero voltage potential during an access of the memory cell comprises sharing of charge between the pre-charged sense line and the bit line.

6. A method for reading a value in a memory cell, comprising:
  holding a bit line associated with the memory cell at a zero voltage potential when the memory cell is not being read;
  releasing the bit line from being held at the zero voltage potential when the memory cell is being read;
  charging the bit line to a first voltage potential greater in value than the zero voltage potential during a read of the memory cell, wherein charging the bit line to a first voltage potential occurs for a first predetermined period of time after a read of the memory cell has begun; and
  reading the memory cell contents during a read access of the memory cell, wherein reading of the memory cell contents occurs for a second predetermined period of time after the read access of the memory cell has begun.

7. The method of claim 6, wherein the first voltage potential comprises a voltage value less than a voltage rail potential utilized by the memory cell.

8. The method of claim 6, further comprising pre-charging a sense line to a second voltage potential prior to the step of charging the bit line to the first voltage potential.

9. The method of claim 8, wherein charging the bit line to a first voltage potential different than the zero voltage potential during a read access of the memory cell comprises sharing of charge between the pre-charged sense line and the bit line.

10. The method of claim 8, wherein charging the bit line to a first voltage potential different than the zero voltage potential during a read access of the memory cell comprises selectively connecting the bit line with the sense line.

* * * * *